(12) United States Patent
Hsieh et al.

(10) Patent No.: US 7,630,222 B2
(45) Date of Patent: Dec. 8, 2009

(54) INVERTER APPARATUS WITH ADAPTABLE VOLTAGE-TO-FREQUENCY CONTROL

(75) Inventors: Ting-Chung Hsieh, Taoyuan Shien (TW); Cheng-Yen Lin, Taoyuan Shien (TW); Sheng-Chieh Chang, Taoyuan Shien (TW); Min-Jon Lee, Taoyuan Shien (TW)

(73) Assignee: Delta Electronics, Inc., Taoyuan (TW)

( * ) Notice: Subject to any disclaimer, the term of this patent is extended or adjusted under 35 U.S.C. 154(b) by 133 days.

(21) Appl. No.: 12/054,524

(22) Filed: Mar. 25, 2008

(65) Prior Publication Data

US 2009/0244935 A1    Oct. 1, 2009

(51) Int. Cl.
*H02M 7/539* (2006.01)
*H02M 7/5387* (2007.01)

(52) U.S. Cl. .......................................... 363/98
(58) Field of Classification Search .................. 363/40, 363/55, 56.01, 56.02, 95, 97, 98, 131, 132
See application file for complete search history.

(56) References Cited

U.S. PATENT DOCUMENTS

| 6,768,284 | B2 * | 7/2004 | Lee et al. ..................... 318/808 |
| 7,177,165 | B2 * | 2/2007 | Deng et al. .................... 363/40 |
| 7,551,108 | B1 * | 6/2009 | Lee ............................. 341/118 |

* cited by examiner

*Primary Examiner*—Gary L Laxton
(74) *Attorney, Agent, or Firm*—Chun-Ming Shih

(57) ABSTRACT

An inverter apparatus has an adaptable high-resolution voltage-to-frequency (V/f) control. The inverter apparatus receives an analog input signal and includes a first circuit, a second circuit, a third circuit, and a micro-controller unit. The first circuit processes a small-signal portion of the analog input signal with a larger voltage gain. The second and the third circuit both processes large-signal portions of the analog input signal with smaller voltage gains respectively. The three processed analog input signals of the first, the second, and the third circuits are converted into three digital output values respectively. The largest digital output value is selected by the micro-controller unit and supplied to a frequency operation unit for generating a corresponding output frequency.

13 Claims, 4 Drawing Sheets

INVERTER APPARATUS WITH ADAPTABLE VOLTAGE-TO-FREQUENCY CONTROL

BACKGROUND OF THE INVENTION

1. Field of the invention

The present invention relates to an inverter apparatus, and more particularly to an inverter apparatus with an adaptable voltage-to-frequency control.

2. Description of the Prior Art

An induction motor is commonly driven in a scalar control method, a vector control method, or a direct torque control method. The principle of the scalar control method is to change synchronous speed of the induction motor by changing input frequency of the induction motor. The scalar control method is also called a voltage-to-frequency control (V/f control) method, or a variable voltage variable frequency control (VVVF control) method. In general, the V/f control method is an open-loop control method, namely, a rotational speed of the induction motor is easily changed by using an inverter without feeding back the rotational speed. However, torque of the induction motor will reduce because output frequency of the inverter increases while input voltage of the inverter is not simultaneously changed. Hence, in order to keep magnetic flux of the induction motor constant to generate maximum efficiency, the ratio of voltage magnitude to operation frequency has to be a constant value, namely, the voltage-to-frequency control (V/f control) method is so called.

Reference is made to FIG. 1 and FIG. 2, wherein the FIG. 1 is a structure block diagram of a prior art inverter apparatus, and the FIG. 2 is a block diagram of converting an analog input voltage into an output frequency of the prior art inverter apparatus. The inverter apparatus 1A comprises a conversion circuit 10A and a micro-controller unit 20A. The conversion circuit 10A includes a first gain unit 10A, a DC-offset unit 102A, and a second gain unit 103A. The first gain unit 101A provides a first voltage gain P1a (P1a=+0.5) to transform the analog input voltage Vin (Vin equals −10 to +10 volts) into a first gain voltage Va (Va equals −5 to +5 volts). The DC-offset unit 102A provides a +5-volt DC-offset voltage Vdc' (Vdc'=+5 volts) and is connected to the first gain unit 101A to generate a modified voltage Vx (Vx equals 0 to +10 volts). The second gain unit 103A provides a second voltage gain P2a (P2a=+0.5) to transform the modified input voltage Vx (Vx equals 0 to +10 volts) into an analog output voltage Vo (Vo equals 0 to +5 volts). The micro-controller unit 20A includes an analog-to-digital converter unit 201A and a frequency operation unit 202A. The analog-to-digital converter unit 201A converts the analog output voltage Vo into a corresponding digital output value, and the frequency operation unit 202A generates a corresponding output frequency according to the digital output value.

A relation between a voltage variation ΔV of the analog input voltage Vin and the analog output voltage Vo of the inverter apparatus 1A is shown as following:

$$\Delta V = (10-(-10))/(5-0) \times 0.1 = 0.4 \text{ (volts)}$$

Namely, the micro-controller unit 20A can receive the analog output voltage Vo in 0.1 volts when the analog input voltage Vin is at least changed in 0.4 volts. Hence, the inverter apparatus 1A can not provide a high-resolution voltage variation to accurately control a drive apparatus.

SUMMARY OF THE INVENTION

Accordingly, a primary object of the present invention is to provide an inverter apparatus with an adaptable voltage-to-frequency control to provide a high-resolution voltage variation to accurately control a drive apparatus.

In order to achieve the objective mentioned above, an inverter apparatus in accordance with the present invention comprises a first circuit, a second circuit, a third circuit, and a micro-controller unit. The first circuit generates a first analog output voltage, the second circuit generates a second analog output voltage, and the third circuit generates a third analog output voltage. The micro-controller unit is electrically connected to the first, the second, and the third circuits; and the micro-controller unit comprises an analog-to-digital converter unit and a frequency operation unit. The analog-to-digital converter unit receives the first, the second, and the third analog output voltages; and the three analog output voltages are converted into three digital output values respectively. The largest digital output value is selected by the micro-controller unit and supplied to the frequency operation unit for generating a corresponding output frequency to control a drive apparatus.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF DRAWING

The above and further advantages of this invention may be better understood by referring to the following description, taken in conjunction with the accompanying drawings, in which.

Figure 1:
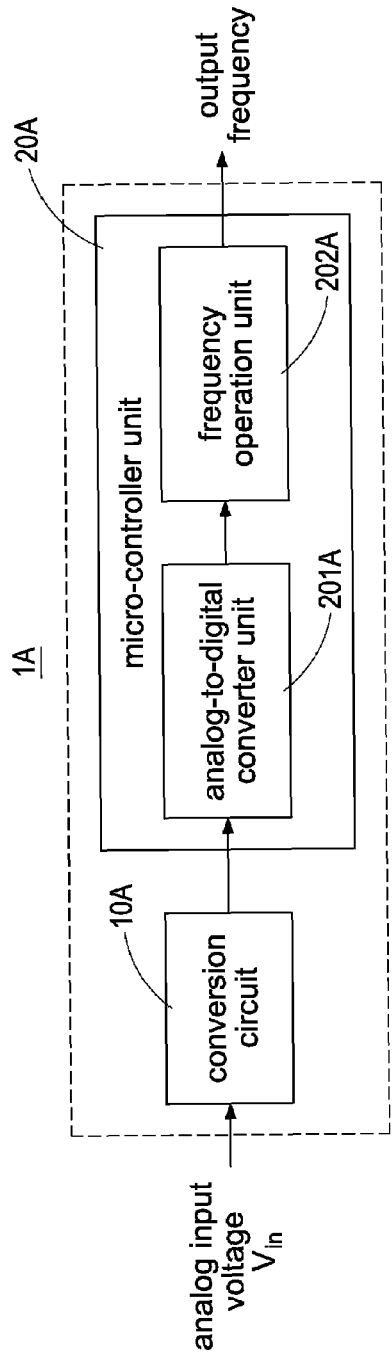
FIG. 1 is a structure block diagram of a prior art inverter apparatus.
Figure 2:
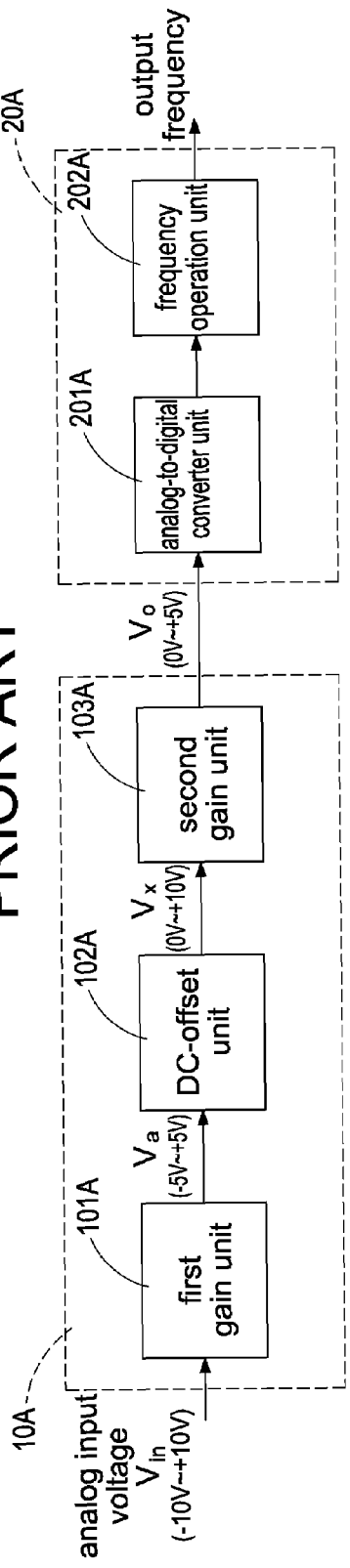
FIG. 2 is a block diagram of converting an analog input voltage into an output frequency of the prior art inverter apparatus.

The drawings will be described further in connection with the following detailed description of the present invention.

DETAILED DESCRIPTION OF THE PREFERRED EMBODIMENTS

Reference will now be made to the drawing figures to describe the present invention in detail.

Figure 3:
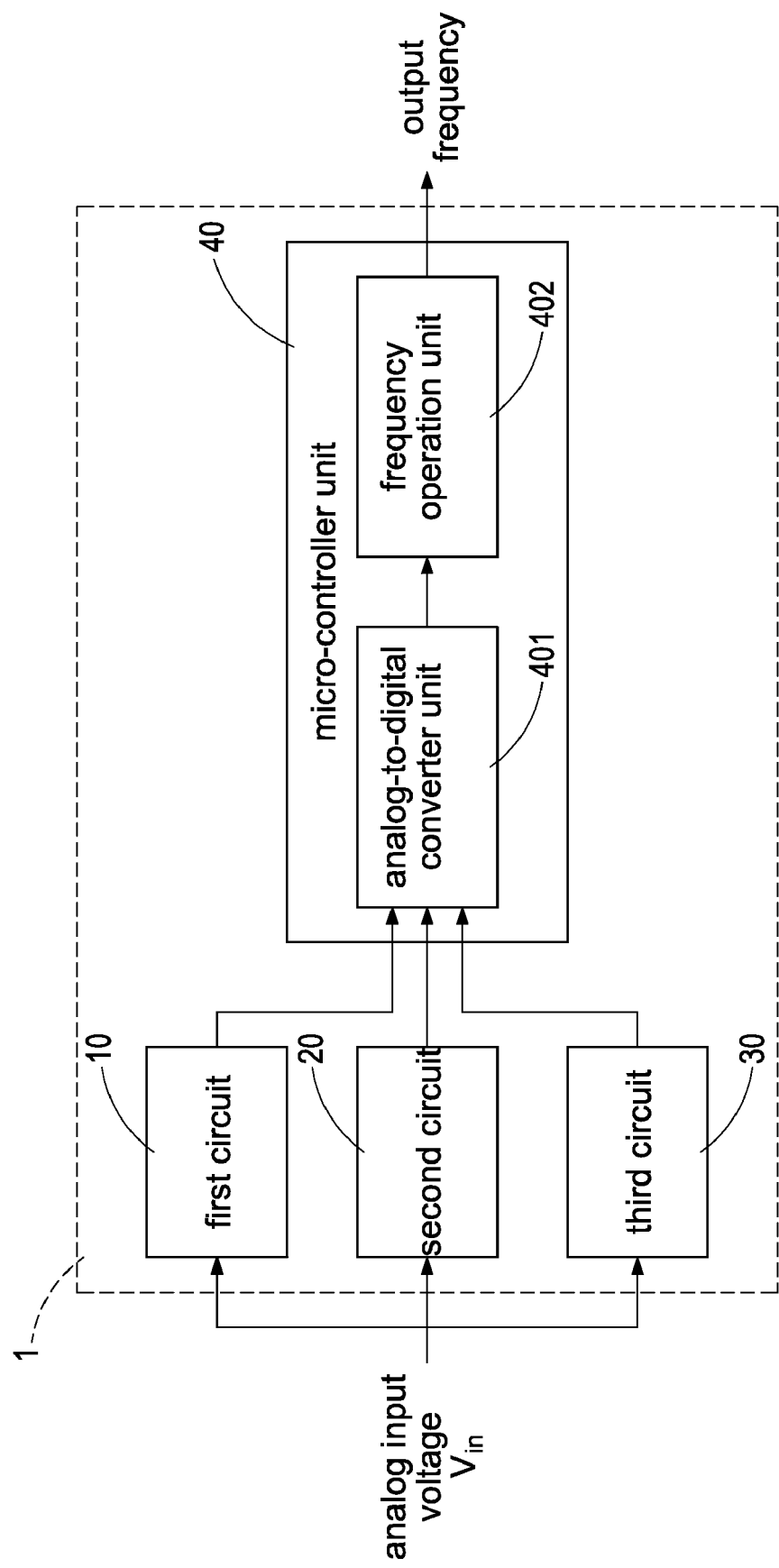
FIG. 3 is a structure block diagram of an inverter apparatus according to the present invention.
Figure 4:
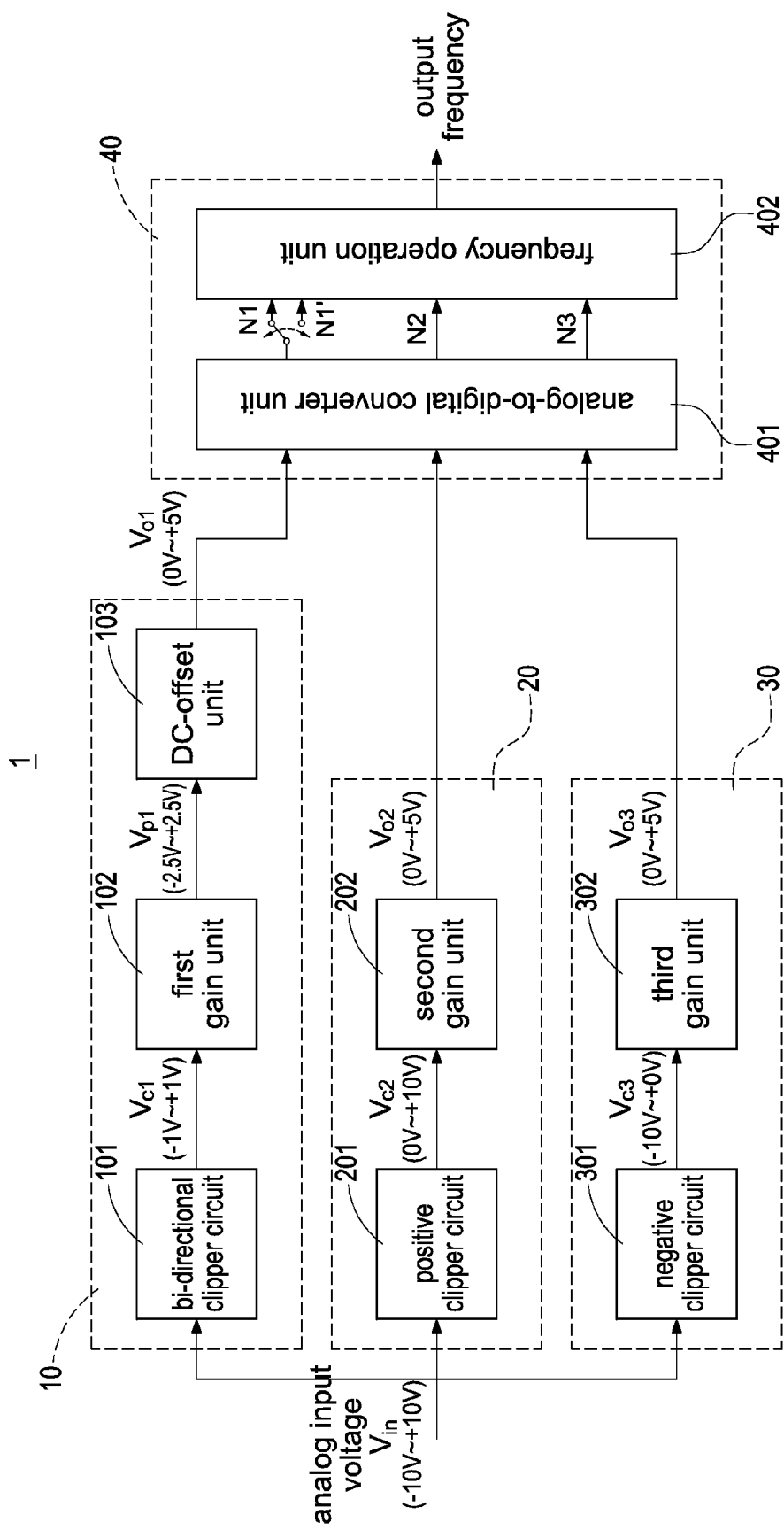
FIG. 4 is a block diagram of a preferred embodiment of converting an analog input voltage into an output frequency.

Reference is made to FIG. 3 and FIG. 4. FIG. 3 is a structure block diagram of an inverter apparatus according to the present invention, and FIG. 4 is a block diagram of a preferred embodiment of converting an analog input voltage into an output frequency. The inverter apparatus 1 comprises a first circuit 10, a second circuit 20, a third circuit 30, and a micro-controller unit 40. The first circuit 10, the second circuit 20, and the third circuit 30 simultaneously receive and process an external analog input voltage Vin.

The first circuit 10 comprises a bi-directional clipper circuit 101, a first gain unit 102, and a DC-offset unit 103. The bi-directional clipper circuit 101 provides a first positive voltage and a first negative voltage for the analog input voltage Vin to generate a first clipping voltage Vc1. The first gain unit 102 is electrically connected to the bi-directional clipper circuit 101 to receive the first clipping voltage Vc1, and the first gain unit 102 provides a first voltage gain P1 for the first clipping voltage Vc1 to generate a first gain voltage Vp1. Namely, the first gain voltage Vp1 is equal to the first clipping voltage Vc1 multiplied by the first voltage gain P1 (Vp1=Vc1×P1). The DC-offset unit 103 is electrically connected to the first gain unit 102 to receive the first gain voltage Vp1, and DC-offset unit 103 provides a DC-offset voltage Vdc for the first gain voltage to generate a first analog output voltage Vo1. Namely, the first analog output voltage Vo1 is equal to the first gain voltage Vp1 added by the DC-offset voltage Vdc (Vo1=Vp1+Vdc).

The second circuit 20 comprises a positive clipper circuit 201 and a second gain unit 202. The positive clipper circuit 201 provides a second positive voltage for the analog voltage Vin to generate a second clipping voltage Vc2. The second gain unit 202 is electrically connected to the positive clipper circuit 201 to receive the second clipping voltage Vc2, and the second gain unit 202 provides a second voltage gain P2 for the second clipping voltage Vc2 to generate a second analog output voltage Vo2. Namely, the second analog output voltage Vo2 is equal to the second clipping voltage Vc2 multiplied by the second voltage gain P2 (Vo2=Vc2×P2).

The third circuit 30 comprises a negative clipper circuit 301 and a third gain unit 302. The negative clipper circuit 301 provides a second negative voltage for the analog input voltage Vin to generate a third clipping voltage Vc3. The third gain unit 302 is electrically connected to the negative clipper circuit 301 to receive the third clipping voltage Vc3, and the third gain unit 302 provides a third voltage gain P3 for the third clipping voltage Vc3 to generate a third analog output voltage Vo3. Namely, the third analog output voltage Vo3 is equal to the third clipping voltage Vc3 multiplied by the third voltage gain P3 (Vo3=Vc3×P3).

The micro-controller unit 40 is electrically connected to the first circuit 10, the second circuit 20, and the third circuit 30; and the micro-controller unit 40 comprises an analog-to-digital converter unit 401 and a frequency operation unit 402. The analog-to-digital converter unit 401 receives the first analog output voltage Vo1, the second analog output voltage Vo2, and the third analog output voltage Vo3; and then converts the three analog output voltages (Vo1, Vo2, Vo3) into a first digital output value N1, a second digital output value N2, and a third digital output value N3 respectively. Afterward, the largest digital output value of the three digital output values (N1, N2, N3) is selected by the micro-controller unit 40.

Furthermore, the micro-controller unit 40 also converts the first digital output value N1 into a first complement digital output value N1' when the first gain voltage Vp1 is positive. Afterward, the largest digital output value of the three digital output values (N1', N2, N3) is selected by the micro-controller unit 40. The first complement digital output value N1' is equal to a maximum digital value Nm of the analog-to-digital converter unit subtracted by the first digital output value N1 (N1'=Nm−N1). The maximum digital value Nm is decided according to bit numbers of the analog-to-digital converter unit 401. For example, if the analog-to-digital converter unit 401 provides a 10-bit resolution, the maximum digital value Nm is 1024 ($2^{10}$=1024). The frequency operation unit 402 is electrically connected to the analog-to-digital converter unit 401 and generates a corresponding output frequency according to the selected largest digital output value to accurately control a drive apparatus.

Figure 5:
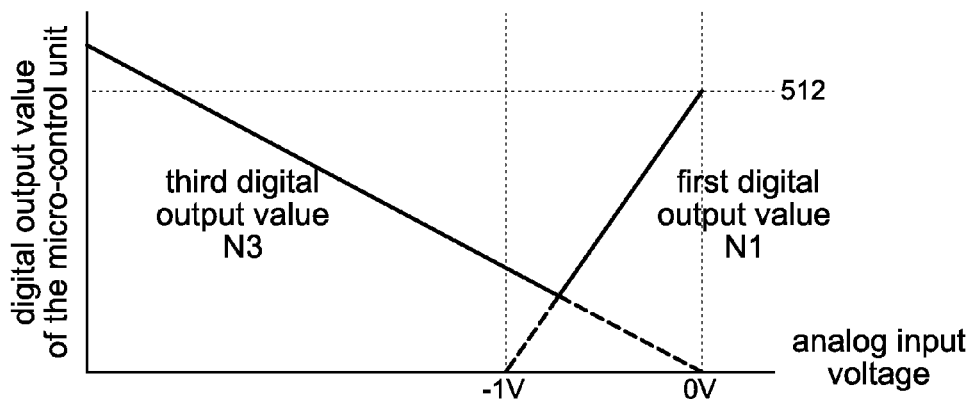
FIG. 5 is a schematic view of comparing a first digital output value with a third digital output value.
Figure 6:
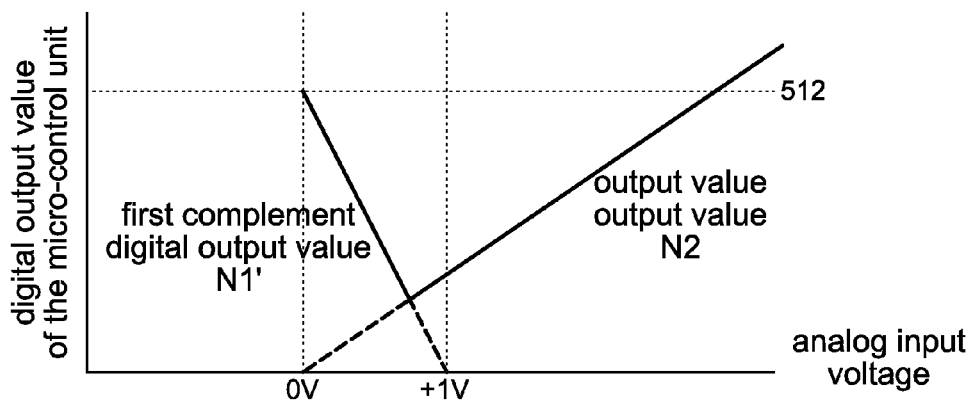
FIG. 6 is a schematic view of comparing a first complement digital output value with a second digital output value.

Reference is made to FIG. 5 and FIG. 6. FIG. 5 is a schematic view of comparing a first digital output value with a third digital output value, and FIG. 6 is a schematic view of comparing a first complement digital output value with a second digital output value. The external analog input voltage Vin is between −10 and +10 volts, and is simultaneously received by the first circuit 10, the second circuit 20, and the third circuit 30. The negative clipper circuit 301 of the third circuit 30 provides a −10-volt second negative voltage to generate a third clipping voltage Vc3 which is between −10 and 0 volt. The positive clipper circuit 201 of the second circuit 20 provides a +10-volt second positive voltage to generate a second clipping voltage Vc2 which is between 0 and +10 volts. The bi-directional clipper circuit 101 of the first circuit 10 provides a +1-volt first positive voltage and a −1-volt first negative voltage to generate a first clipping voltage Vc1 which is between −1 volt and +1 volt. Furthermore, the operations of the three circuits (10, 20, 30) are described as following:

The third gain unit 302 provides a third voltage gain P3 of (−0.5), and the third clipping voltage Vc3 is transmitted to the third gain unit 302 to generate a third analog output voltage Vo3 which is between 0 and +5 volts. Namely, the third analog output voltage Vo3 is equal to the third clipping voltage Vc3 multiplied by the third voltage gain P3.

The analog-to-digital converter unit 401 of the micro-controller unit 40 converts the third analog output voltage Vo3 into a third digital output value N3. The first equation shows a conversion relation between the third analog output voltage Vo3 and the third digital output value N3, as following:

$$N3 = 2^n \times Vo3/5 \qquad \text{(equation 1)}$$

Wherein the analog-to-digital converter unit 401 provides an n-bit resolution, and the third digital output value N3 is between 0 and 1023 when n is equal to 10.

The second gain unit 202 provides a second voltage gain P2 of (+0.5), and the second clipping voltage Vc2 is transmitted to the second gain unit 202 to generate a second analog output voltage Vo2 which is between 0 and +5 volts. Namely, the second analog output voltage Vo2 is equal to the second clipping voltage Vc2 multiplied by the second voltage gain P2.

The analog-to-digital converter unit 401 of the micro-controller unit 40 converts the second analog output voltage Vo2 into a second digital output value N2. The second equation shows a conversion relation between the second analog output voltage Vo2 and the second digital output value N2, as following:

$$N2 = 2^n \times Vo2/5 \qquad \text{(equation 2)}$$

Wherein the analog-to-digital converter unit 401 provides an n-bit resolution, and the second digital output value N2 is between 0 and 1023 when n is equal to 10.

The first gain unit 102 provides a first voltage gain P1 of (+0.5), and the first clipping voltage Vc1 is transmitted to the first gain unit 102 to generate a first gain voltage Vp1 which is between −2.5 and +2.5 volts. Namely, the first gain voltage Vp1 is equal to the first clipping voltage Vc1 multiplied by the first voltage gain P1 (Vp1=Vc1×P1). The DC-offset unit 103 provides a +2.5-volt DC-offset voltage Vdc, and the first gain voltage Vp1 is transmitted to the DC-offset unit 103 to generate a first analog output voltage Vo1 which is between 0 and +5 volts. Namely, the second analog output voltage Vo1 is equal to the first gain voltage Vp1 added by the DC-offset voltage Vdc (Vo1=Vp1+Vdc).

The analog-to-digital converter unit 401 of the micro-controller unit 40 converts the first analog output voltage Vo1 into a first digital output value N1. The third equation shows a conversion relation between the first analog output voltage Vo1 and the first digital output value N1, as following:

$$N1 = 2^n \times Vo1/5 \quad \text{(equation 3)}$$

Wherein, the analog-to-digital converter unit 401 provides an n-bit resolution. The micro-controller unit 40 further converts the first digital output value N1 into a first complement digital output value N1' when the first gain voltage Vp1 is positive. The first complement digital output value N1' is equal to a maximum digital value Nm of the analog-to-digital converter unit subtracted by the first digital output value N1 (N1'=Nm−N1). The maximum digital value Nm is decided according to bit numbers of the analog-to-digital converter unit 401. For example, if the analog-to-digital converter unit 401 provides an n-bit resolution, the maximum digital value Nm is $2^n$. The fourth equation shows a conversion relation between the first complement digital output value N1' and the first digital output value N, as following:

$$N1' = Nm - N1 = (2^n - 1) - N1 \quad \text{(equation 4)}$$

Wherein the analog-to-digital converter unit 401 provides an n-bit resolution, and the first digital output value N1 is between 0 and 512 (as shown in equation 3) when n is equal to 10 and the first analog output voltage is between 0 and +2.5 volts; and the first complement digital output value N1' is between 511 and 0 (as shown in equation 4) when n is equal to 10 and the first analog output voltage is between +2.5 and +5 volts. The first digital output value N1 or the first complement digital output value N1' is transmitted to the frequency operation unit 402 for comparison.

The frequency operation unit 402 is electrically connected to the analog-to-digital converter unit 401 and to generate a corresponding output frequency according to the selected largest digital output value from the first digital output value N1, the first complement digital output value N1', the second digital output value N2, and the third digital output value N3.

Wherein the corresponding output frequency is calculated as following:

(1) The corresponding output frequency fo of the frequency operation unit 402 is shown in equation 5 when the third digital output value N3 is the largest digital output value:

$$fo = N3/2^n \times 60 \text{ (Hz)} \quad \text{(equation 5)}$$

(2) The corresponding output frequency fo of the frequency operation unit 402 is shown in equation 6 when the second digital output value N2 is the largest digital output value:

$$fo = N2/2^n \times 60 \text{ (Hz)} \quad \text{(equation 6)}$$

(3) The corresponding output frequency fo of the frequency operation unit 402 is shown in equation 7 when the first digital output value N1 is the largest digital output value:

$$fo = N1/2^n \times 60 \text{ (Hz)} \quad \text{(equation 7)}$$

(4) The corresponding output frequency fo of the frequency operation unit 402 is shown in equation 8 when the first complement digital output value N1' is the largest digital output value:

$$fo = N1'/2^n \times 60 \text{ (Hz)} \quad \text{(equation 8)}$$

A view of voltage variation is further supplied to make a description:

(1) A relation between a voltage variation $\Delta V3$ of the analog input voltage Vin and the third analog output voltage Vo3 is shown as following when the analog input voltage Vin is between −10 and 0 volts:

$$\Delta V3 = (0-(-10))/(5-0) \times 0.1 = 0.2 \text{ (volts)}$$

Namely, the micro-controller unit 40 can receive the third analog output voltage Vo3 in 0.1 volts variation when the analog input voltage Vin is changed in 0.2 volts. Hence, the resolution ($\Delta V3=0.2$ volts) is better than the voltage resolution ($\Delta V=0.4$ volts) of the prior art.

(2) A relation between a voltage variation $\Delta V2$ of the analog input voltage Vin and the second analog output voltage Vo2 is shown as following when the analog input voltage Vin is between 0 and +10 volts:

$$\Delta V2 = (10-0)/(5-0) \times 0.1 = 0.2 \text{ (volts)}$$

Namely, the micro-controller unit 40 can receive the second analog output voltage Vo2 in 0.1 volts variation when the analog input voltage Vin is changed in 0.2 volts. Hence, the resolution ($\Delta V2=0.2$ volts) is better than the voltage resolution ($\Delta V=0.4$ volts) of prior art.

(3) A relation between a voltage variation $\Delta V1$ of the analog input voltage Vin and the first analog output voltage Vo1 is shown as following when the analog input voltage Vin is between −1 and +1 volts:

$$\Delta V1 = (1-(-1))/(5-0) \times 0.1 = 0.04 \text{ (volts)}$$

Namely, the micro-controller unit 40 can receive the first analog output voltage Vo1 in 0.1 volts variation when the analog input voltage Vin is changed in 0.04 volts. Hence, the resolution ($\Delta V1=0.04$ volts) is better than the voltage resolution ($\Delta V=0.4$ volts) of prior art.

It follows from what has been said that the present invention has the following advantages:

1. The inverter apparatus provides a larger voltage gain in a small-signal portion of the analog input signal and a smaller voltage gain in a large-signal portion of the analog input signal.

2. The inverter apparatus provides a high-resolution voltage variation to accurately control a drive apparatus.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An inverter apparatus with an adaptable voltage-to-frequency control, comprising:
   a first circuit receiving an analog input voltage, and comprising:
       a bi-directional clipper circuit providing a first positive voltage and a negative voltage for the analog input voltage to generate a first clipping voltage;
       a first gain unit electrically connected to the bi-directional clipper circuit and providing a first voltage gain for the first clipping voltage to generate a first gain voltage; and
       a DC-offset unit electrically connected to the first gain unit and providing a DC-offset voltage for the first gain voltage to generate a first analog output voltage;
   a second circuit simultaneously receiving the analog input voltage, and comprising:
       a positive clipper circuit providing a second positive voltage for the analog input voltage to generate a second clipping voltage; and a second gain unit electrically connected to the positive clipper circuit and providing a second voltage gain for the second clipping voltage to generate a second analog output voltage;

a third circuit simultaneously receiving the analog input voltage, and comprising:

a negative clipper circuit providing a second negative voltage for the analog input voltage to generate a third clipping voltage; and a third gain unit electrically connected to the negative clipper circuit and providing a third voltage gain for the third clipping voltage to generate a third analog output voltage; and a micro-controller unit electrically connected to the first circuit, the second circuit, and the third circuit, and comprising:

an analog-to-digital converter unit receiving the first, the second, and the third analog output voltages; and converting the three analog output voltages into a first digital output value, a first complement digital output value, a second digital output value, and a third digital output value respectively; and a frequency operation unit electrically connected to the analog-to-digital converter unit and generating a corresponding output frequency according to the selected largest digital output value.

2. The inverter apparatus in claim 1, wherein the first positive voltage is +1 volt and the first negative voltage is −1 volt.

3. The inverter apparatus in claim 1, wherein the first voltage gain is 2.5.

4. The inverter apparatus in claim 1, wherein the first gain voltage is equal to the first clipping voltage multiplied by the first voltage gain.

5. The inverter apparatus in claim 1, wherein the DC-offset voltage is 2.5 volts.

6. The inverter apparatus in claim 1, wherein the first analog output voltage is equal to the first gain voltage added by the DC-offset voltage.

7. The inverter apparatus in claim 1, wherein the second positive voltage is +10 volts.

8. The inverter apparatus in claim 1, wherein the second analog output voltage is equal to the second clipping voltage multiplied by the second voltage gain.

9. The inverter apparatus in claim 1, wherein the second negative voltage is −10 volts.

10. The inverter apparatus in claim 1, wherein the second voltage gain is 0.5.

11. The inverter apparatus in claim 1, wherein the third voltage gain is −0.5.

12. The inverter apparatus in claim 1, wherein the third analog output voltage is equal to the third clipping voltage multiplied by the third voltage gain.

13. The inverter apparatus in claim 1, wherein the first complement digital output value is equal to the maximum digital value of the analog-to-digital converter unit subtracted by the first digital output value.

* * * * *